United States Patent
Kang et al.

(10) Patent No.: US 12,514,038 B2
(45) Date of Patent: Dec. 30, 2025

(54) MICRO LED AND DISPLAY MODULE HAVING SAME

(71) Applicant: SAMSUNG ELECTRONICS CO., LTD., Suwon-si (KR)

(72) Inventors: Jihoon Kang, Suwon-si (KR); Jitsuo Ota, Suwon-si (KR); Myunghee Kim, Suwon-si (KR); Jenghun Suh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 376 days.

(21) Appl. No.: 18/094,718

(22) Filed: Jan. 9, 2023

(65) Prior Publication Data

US 2023/0163260 A1 May 25, 2023

Related U.S. Application Data

(63) Continuation of application No. PCT/KR2021/012472, filed on Sep. 14, 2021.

(30) Foreign Application Priority Data

Sep. 29, 2020 (KR) .................. 10-2020-0127489

(51) Int. Cl.
*H10H 20/851* (2025.01)
*H01L 25/075* (2006.01)
(Continued)

(52) U.S. Cl.
CPC ..... *H10H 20/8514* (2025.01); *H01L 25/0753* (2013.01); *H10H 20/8312* (2025.01); *H10H 20/8512* (2025.01); *H10H 20/857* (2025.01)

(58) Field of Classification Search
CPC ........... H10H 20/8514; H10H 20/8312; H10H 20/8512; H10H 20/857; H10H 20/84;
(Continued)

(56) References Cited

U.S. PATENT DOCUMENTS 7,361,938 B2  4/2008  Mueller et al.
8,030,672 B2  10/2011 Harada
(Continued)

FOREIGN PATENT DOCUMENTS

JP   2002-217454 A   8/2002
JP   2012-60180 A    3/2012
(Continued)

OTHER PUBLICATIONS

European Extended Search Report issued Dec. 12, 2023 by the European Patent Office for EP Patent Application No. 21875954.6.
(Continued)

*Primary Examiner* — Mohammad A Rahman
(74) *Attorney, Agent, or Firm* — Sughrue Mion, PLLC

(57) ABSTRACT

A micro LED and a display module are provided. The micro LED includes a first semiconductor layer having a light emission surface and electronically connected to a first electrode; a second semiconductor layer electronically connected to a second electrode; an active layer disposed between the first and second semiconductor layers; and a wavelength conversion layer stacked on the light emission surface of the first semiconductor layer. The wavelength conversion layer is made of a semiconductor having a chalcopyrite-structure. The display module includes a plurality of such plurality of micro LEDs arranged in pixel units, which are electronically connected to a plurality of TFT electrodes. The module also includes a glass substrate and a TFT layer formed on one surface of the glass substrate, and the plurality of TFT electrodes are formed on the TFT layer. The resulting TFT layer does not require a color filter or a cover layer.

14 Claims, 19 Drawing Sheets

(51) Int. Cl.
*H10H 20/831* (2025.01)
*H10H 20/857* (2025.01)

(58) Field of Classification Search
CPC .............. H10H 20/841; H10H 20/8513; H01L 25/0753; H01L 25/167
See application file for complete search history.

(56) References Cited

U.S. PATENT DOCUMENTS

| | | | |
|---|---|---|---|
| 8,664,635 | B2 | 3/2014 | Jung et al. |
| 9,359,260 | B2 | 6/2016 | Mueller et al. |
| 9,419,186 | B2 | 8/2016 | Jung et al. |
| 9,599,857 | B2 | 3/2017 | Bibl et al. |
| 9,722,148 | B2 | 8/2017 | Mueller et al. |
| 9,793,448 | B2 | 10/2017 | Jung et al. |
| 9,966,511 | B2 | 5/2018 | Lopez |
| 10,043,955 | B2 | 8/2018 | Jung et al. |
| 10,120,110 | B2 | 11/2018 | Tokinoya et al. |
| 10,290,775 | B2 | 5/2019 | Mueller et al. |
| 10,461,230 | B2 | 10/2019 | Lopez |
| 10,886,437 | B2 | 1/2021 | Camras et al. |
| 10,930,231 | B2 | 2/2021 | Kim et al. |
| 11,238,818 | B2 | 2/2022 | Kim et al. |
| 2005/0269582 | A1 | 12/2005 | Mueller et al. |
| 2007/0267646 | A1 | 11/2007 | Wierer, Jr. et al. |
| 2008/0138919 | A1 | 6/2008 | Mueller et al. |
| 2011/0284822 | A1 | 11/2011 | Jung et al. |
| 2012/0074448 | A1 | 3/2012 | Wierer, Jr. et al. |
| 2014/0151633 | A1 | 6/2014 | Jung et al. |
| 2015/0179876 | A1* | 6/2015 | Hu ................... H10H 20/835 257/13 |
| 2016/0087171 | A1 | 3/2016 | Lopez |
| 2016/0133676 | A1* | 5/2016 | Kim ................... H10K 59/122 438/35 |
| 2016/0211422 | A1* | 7/2016 | Kazama ............... H10H 20/856 |
| 2016/0254418 | A1 | 9/2016 | Mueller et al. |
| 2016/0351759 | A1 | 12/2016 | Jung et al. |
| 2017/0069794 | A1 | 3/2017 | Kim |
| 2017/0309791 | A1 | 10/2017 | Mueller et al. |
| 2018/0006198 | A1 | 1/2018 | Jung et al. |
| 2018/0106460 | A1 | 4/2018 | Van Bommel et al. |
| 2018/0122993 | A1 | 5/2018 | Camras et al. |
| 2018/0163126 | A1 | 6/2018 | Murphy et al. |
| 2018/0254390 | A1 | 9/2018 | Lopez |
| 2019/0074324 | A1* | 3/2019 | Kim ................... H10D 86/451 |
| 2019/0157517 | A1 | 5/2019 | Koposov |
| 2019/0189879 | A1 | 6/2019 | Tandon et al. |
| 2019/0304386 | A1 | 10/2019 | Kim et al. |
| 2020/0225532 | A1* | 7/2020 | Tran ................... H10K 59/50 |
| 2021/0142748 | A1 | 5/2021 | Kim et al. |

FOREIGN PATENT DOCUMENTS

| | | | | |
|---|---|---|---|---|
| JP | 6286026 | B2 | 2/2016 | |
| JP | 2016-218151 | A | 12/2016 | |
| KR | 10-1230619 | B1 | 2/2013 | |
| KR | 10-2013-0071077 | A | 6/2013 | |
| KR | 20130071077 | A * | 6/2013 | ......... H10H 20/0361 |
| KR | 10-2015-0069228 | A | 6/2015 | |
| KR | 10-2016-0140717 | A | 12/2016 | |
| KR | 10-2017-0028082 | A | 3/2017 | |
| KR | 10-2017-0073353 | A | 6/2017 | |
| KR | 10-2019-0077487 | A | 7/2019 | |
| KR | 10-2019-0113535 | A | 10/2019 | |
| KR | 10-2020-0096648 | A | 8/2020 | |

OTHER PUBLICATIONS

Search Report (PCT/ISA/210) issued Dec. 23, 2021 by the International Searching Authority for International Patent Application No. PCT/KR2021/012472.

Written Opinion (PCT/ISA/237) issued Dec. 23, 2021 by the International Searching Authority for International Patent Application No. PCT/KR2021/012472.

Office Action dated Jul. 27, 2025, issued by the Korean Patent Office in Korean Patent Application No. 10-2020-0127489.

\* cited by examiner

MICRO LED AND DISPLAY MODULE HAVING SAME

CROSS-REFERENCE TO RELATED APPLICATIONS

This application is a continuation bypass of International Patent Application No. PCT/KR2021/012472, filed on Sep. 14, 2021, with the World Intellectual Property Organization, which is based on and claims priority to Korean Patent Application No. 10-2020-0127489, filed on Sep. 29, 2020, in the Korean Intellectual Property Office, the disclosures of each of which are incorporated by reference herein in their entireties.

BACKGROUND

1. Field

The disclosure relates to a micro LED and a display module including the same, and more particularly, to a micro LED including a wavelength conversion layer, and a display module including a plurality of micro LEDs arranged in pixel units on a thin film transistor (TFT) substrate.

2. Description of Related Art

Light emitting diodes (LEDs) are being applied in various industrial fields because of their relatively high light emitting efficiency and long lifespan. In particular, LEDs are being commercialized in the field of displays as well as in the field of general lightings.

In recently developed LED displays (e.g., a full-color micro LED display), micro LEDs of at least three colors of R/G/B are integrated in one pixel. However, with the trend of high performance and high efficiency of a display, there is a continuing demand for improvement of light emitting efficiency of an LED device. In particular, in the field of development of nano-size LEDs such as micro LEDs, improvement of light emitting efficiency of an LED is emerging as an important task to be resolved together with improvement of procedural efficiency.

In the case of a micro LED, non-radiative recombination appears around a side surface formed by mesa etching during a manufacturing process. The non-radiative recombination not only reduces quantum efficiency of a micro LED, but it also becomes a factor for thermal droop. When the temperature of thermal droop increases, light output of a micro LED decreases.

Meanwhile, in the conventional wavelength conversion technology applied to a display, fluorescent materials on which quantum dots or rare earth elements are doped are being used widely. Quantum dots are based on semiconductor nano particles such as InP and CdSe.

Quantum dots are unstable thermally and chemically. Accordingly, a quantum dot layer provided in an LED package is arranged to be distanced from a micro LED, which is a heat source and a light source, as much as possible for avoiding degradation. For this, an LED package includes a cover layer between a quantum dot layer and a blue micro LED. However, the thickness of a quantum dot layer is being manufactured to exceed 5 μm in general, due to a low absorption coefficient of about $10^4$ cm$^{-1}$ or smaller. Due to this, there is a problem that the thickness of the LED package increases and the structure becomes complex.

Also, a phosphor on which a rare earth element is doped is a commonly used material in wavelength conversion. Until now, various types of materials such as yttrium aluminum garnet doped with Ce, CaAlSiN doped with Eu, and SiAlON doped with Eu have been used in the field of lightings and liquid crystal displays. However, due to low absorption coefficients ($10^3$ cm$^{-1}$ or smaller) of these materials in blue and UV wavelength areas, the required thickness of a phosphor on which a rare earth element is doped is scores of μm. Accordingly, a supporting structure is generally required to avoid structural weakness. Also, if there is partial permeation of blue and UV excite lights through a wavelength conversion layer, the permeated excite lights reduce color reproducibility of a display, and thus a color filter that can block excite lights is needed. Due to this, a complex structure and a complex process are required in use of a conventional wavelength conversion material applied to an LED package, and thus there is a problem that the cost increases, and productivity decreases.

SUMMARY

For resolving the aforementioned problem, the disclosure provides a micro LED of a simple structure including a thin wavelength conversion layer that does not require a color filter or a cover layer, and a display module including the same.

In accordance with certain embodiments of the present disclosure, a micro LED is provided. The micro LED includes a first semiconductor layer which has a light emission surface and to which a first electrode is electronically connected, a second semiconductor layer to which a second electrode is electronically connected, an active layer arranged between the first and the second semiconductor layers, and a wavelength conversion layer which is stacked on the light emission surface of the first semiconductor layer. The wavelength conversion layer includes a semiconductor in a chalcopyrite-structure.

In accordance with other embodiments of the present disclosure, a display module is provided. The display module includes a TFT substrate including a glass substrate and a thin film transistor (TFT) layer formed on one surface of the glass substrate, and a plurality of micro light emitting diodes (LEDs) which are electronically connected to a plurality of TFT electrodes formed on the TFT layer, the plurality of micro LEDs being arranged in pixel units. Each of the plurality of micro LEDs respectively include a first semiconductor layer which has a light emission surface and to which a first electrode is electronically connected, a second semiconductor layer to which a second electrode is electronically connected, an active layer arranged between the first and the second semiconductor layers, and a wavelength conversion layer which is stacked on the light emission surface of the first semiconductor layer. Each wavelength conversion layer includes a semiconductor in a chalcopyrite-structure.

BRIEF DESCRIPTION OF THE DRAWINGS

Features and aspects of certain exemplary embodiments of the disclosure will be described below with reference to the accompanying drawings, in which like reference numerals denote like elements, and wherein.

DETAILED DESCRIPTION

Figure 1:
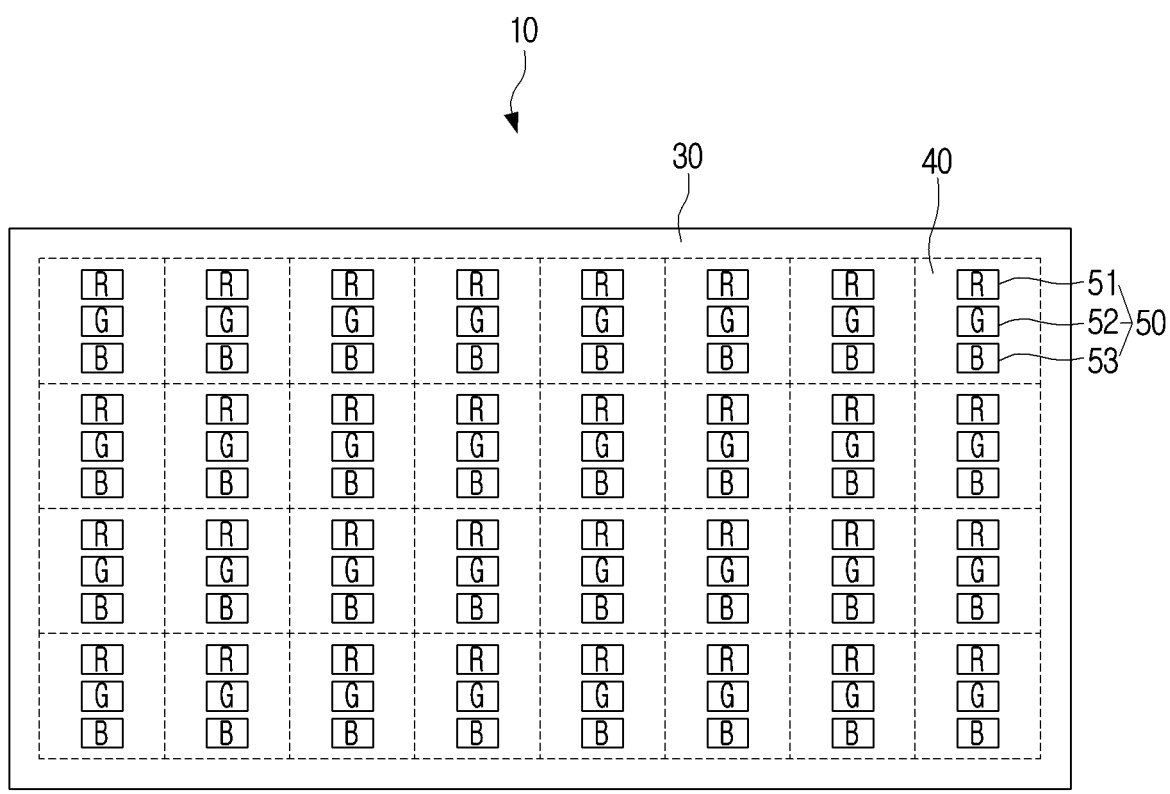
FIG. 1 is a plan view illustrating a display module including a plurality of pixels having R/G/B sub pixels according to an embodiment of the disclosure.

Hereinafter, various embodiments will be described in more detail with reference to the accompanying drawings. The embodiments described in the disclosure may be modified in various forms. Also, specific embodiments may be illustrated in the drawings, and explained in detail in the detailed description. However, the specific embodiments described in the accompanying drawings are just for making the various embodiments understood easily. Therefore, the technical idea of the disclosure is not limited by the specific embodiments described in the accompanying drawings, but they should be interpreted to include all equivalents or alternatives included in the ideas and the technical scopes of the disclosure.

Also, terms including ordinal numbers such as 'the first' and 'the second' may be used to describe various components, but these components are not limited by the aforementioned terms. The aforementioned terms are used only for the purpose of distinguishing one component from another component.

In addition, in the disclosure, terms such as "include" or "have" should be construed as designating that there are such characteristics, numbers, steps, operations, elements, components, or a combination thereof described in the disclosure, but not as excluding in advance the existence or possibility of adding one or more of other characteristics, numbers, steps, operations, elements, components, or a combination thereof.

Other than the above, in describing the disclosure, where it is determined that detailed explanation of related known functions or features may unnecessarily confuse the gist of the disclosure, the detailed explanation will be abridged or omitted.

Herein, on the front surface of a glass substrate, a thin film transistor (TFT) layer for forming a TFT circuit may be arranged, and on the rear surface, a driving circuit for driving the TFT circuit of the TFT layer may be arranged. The glass substrate may be formed as a quadrangle type. Specifically, the glass substrate may be formed as a rectangle or a square.

Herein, a structure in which a TFT layer (or a backplane) is stacked on a glass substrate may be referred to as a TFT substrate. The TFT substrate is not limited to a specific structure or type. For example, the TFT substrate may be implemented as an oxide TFT and an Si TFT (poly silicon, a-silicon), an organic TFT, a graphene TFT, or a low temperature polycrystalline silicon (LTPS) TFT. Also, a P-type (or an N-type) metal oxide semiconductor field effect transistor (MOSFET) may be made in an Si wafer complementary metal oxide semiconductor (CMOS) process, and applied.

In an embodiment, the front surface of the glass substrate on which a TFT layer is arranged may be divided into an active area and an inactive area. The active area may fall under an area occupied by the TFT layer on one surface of the glass substrate, and the inactive area may fall under an edge area on one surface of the glass substrate. The edge area may include a side surface of the glass substrate. Also, the edge area may be the remaining area excluding the area wherein the TFT circuit is arranged on the front surface of the glass substrate and the area wherein the driving circuit is arranged on the rear surface. Further, the edge area may include a side surface of the glass substrate, and a portion of the front surface of the glass substrate and a portion of the rear surface of the glass substrate adjacent to the side surface.

In an embodiment, on the glass substrate, a plurality of front surface connection pads electronically connected with the TFT circuit through a wiring may be formed in the edge area of the front surface, and a plurality of rear surface connection pads electronically connected with the driving circuit through a wiring may be formed in the edge area of the rear surface. The plurality of front surface and rear surface connection pads may be arranged to be respectively inserted at a specific distance from the side surface of the glass substrate to the inner side of the glass substrate. The connection pads respectively formed on the front surface and the rear surface of the glass substrate may be electronically connected by a side surface wiring formed in the edge area of the glass substrate.

In an embodiment, on the TFT layer of the glass substrate, a plurality of pixels may be arranged. Each pixel may include a plurality of sub pixels, and one sub pixel may correspond to one micro LED. The TFT layer may include a TFT circuit for driving each pixel. A micro LED may be a semiconductor chip that includes an inorganic light emitting material, and that can emit light by itself when power is supplied. Also, a micro LED may have a flip chip structure wherein anode and cathode electrodes are formed on the same surface, and a light emitting surface is formed on the opposite side of the electrodes.

In an embodiment, the number of pixels mounted on the TFT substrate (including the glass substrate and the TFT layer stacked on the glass substrate) may be determined by the resolution of the display. Also, micro LEDs may be arranged on the TFT substrate in pixel units. Herein, the feature of "being arranged in pixel units" means that a plurality of pixels are grouped into "pixel units" having the same pattern and each arranged in respective "pixel areas".

In an embodiment, the TFT layer formed in a stack on the glass substrate is electronically connected to a micro LED. Specifically, the electrode pad of the micro LED may be electronically connected to the electrode pad on the TFT layer, and the electrode of the micro LED and the TFT electrode may have a joint structure in a state of metal binding.

In an embodiment, a display module including micro LEDs may be a flat display panel. The micro LEDs may be inorganic light emitting diodes (LEDs) having a size of 100 μm or smaller. The display module including micro LEDs can provide better contrast, faster response time, and higher energy efficiency than a liquid crystal display (LCD) panel which needs a backlight. Both of an organic light emitting diode (OLED) which is an organic light emitting device and a micro LED which is an inorganic light emitting device have good energy efficiency, but a micro LED has better brightness and light emitting efficiency, and a longer lifespan than an OLED.

In an embodiment, in the display module, black matrices may be formed among the plurality of micro LEDs arranged on the TFT layer. The black matrices can improve the contrast ratio by blocking leakage of light in the ambient part of micro LEDs adjacent to one another.

In an embodiment, the display module may further include a touch screen panel arranged on the side wherein the plurality of micro LEDs emit light, and also, the display module may include a touch screen driver for driving the touch screen panel.

In an embodiment, the display module may further include a rear substrate that is arranged on the rear surface of the glass substrate, and is electronically connected through a flexible printed circuit (FPC), etc., and also, the display module may further include a communication device that can receive data.

In an embodiment, the glass substrate on which micro LEDs are mounted and a side surface wiring is formed may be referred to as a display module. Such a display module may be installed and applied in a single unit on wearable devices, portable devices, handheld devices, and various kinds of electronic products or electronic components which need displays. Also, the display module may be applied as a matrix type to display devices such as monitors for personal computers (PCs), high resolution TVs and signage (or, digital signage), and electronic displays through a plurality of assembly arrangements.

Hereinafter, the display module according to an embodiment of the disclosure will be described in detail with reference to the drawings.

Figure 2:
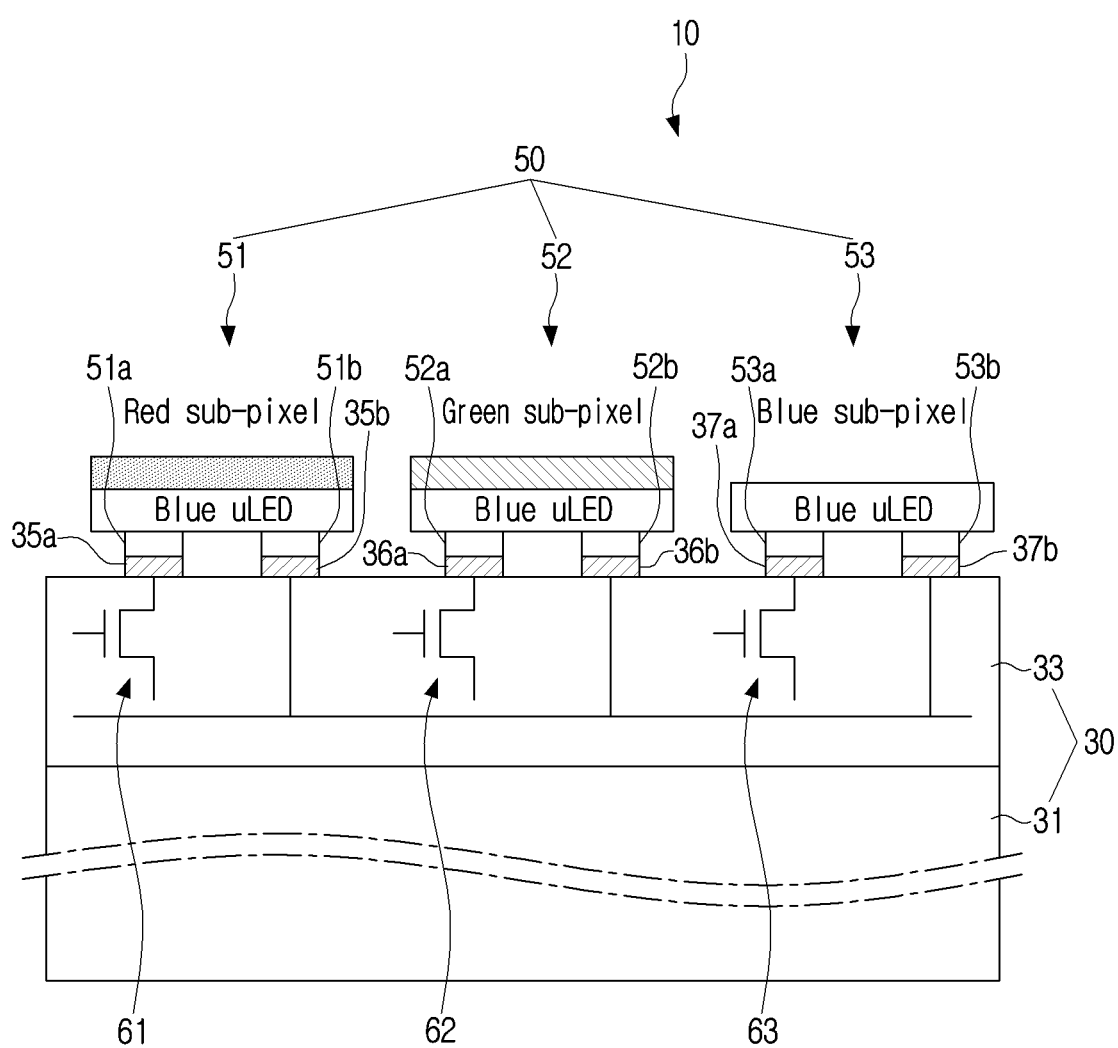
FIG. 2 is a side view schematically illustrating a pixel of a display module according to an embodiment of the disclosure.

FIG. 1 is a plan view illustrating a display module including a plurality of pixels having R/G/B sub pixels according to an embodiment of the disclosure, and FIG. 2 is a side view schematically illustrating a pixel of a display module according to an embodiment of the disclosure.

Referring to FIG. 1, the display module 10 may include a TFT substrate 30, a panel driver (not shown), and a processor (not shown).

Referring to FIG. 2, the TFT substrate 30 may include a glass substrate 31 and a TFT layer 33 formed on the front surface of the glass substrate 31. The TFT layer 33 may include a plurality of pixel areas 40. Each pixel area 40 may include a plurality of sub pixels and a plurality of pixel circuits for driving each sub pixel. The plurality of sub pixels in the pixel area 40, and their arrangement in the pixel area 40, may be the "pixel unit" described earlier herein. The plurality of sub pixels and the plurality of pixel circuits arranged in each pixel area 40 will be described in detail below.

The TFT substrate 30 is formed such that gate lines and data lines intersect with one another, and pixel circuits may be formed in the area provided by the intersection.

The panel driver drives the plurality of pixel circuits of the TFT substrate 30 according to control by the processor. The panel driver may include a timing controller, a data driver, and a gate driver.

The timing controller may receive input of an input signal, a horizontal synchronization signal, a vertical synchronization signal, and a main clock signal, etc. from the outside and generate an image data signal, a scan control signal, a data control signal, a light emission control signal, etc., and may provide the signals to the TFT substrate 30, the data driver, the gate driver, etc.

In particular, the timing controller may apply a control signal MUX Sel R, G, B for selecting one sub pixel among R, G, B sub pixels to the driving circuit.

The data driver (or a source driver) is a means for generating a data signal, and receives image data of R/G/B components, etc. from the processor and generates a data voltage (e.g., a pulse width modulation (PWM) data voltage, a pulse amplitude modulation (PAM) data voltage). Also, the data driver may apply the generated data signal to the TFT substrate 30.

The gate driver is a means for generating various kinds of control signals such as a control signal SPWM (n), a control signal SPAM, etc., and transmits the generated various kinds of control signals to a specific row (or, a specific horizontal line) of the TFT substrate 30, or transmits the signals to the entire lines. Also, the gate driver may apply a driving voltage VDD to the driving voltage terminal of the driving circuit, depending on embodiments.

All or a part of the data driver and the gate driver may be implemented on the TFT layer 33, or implemented as a separate semiconductor IC, and arranged on the rear surface of the glass substrate 31.

The processor controls the overall operations of the display module 10. In particular, the processor may drive the TFT substrate 30 by controlling the panel driver, and thereby make the plurality of pixel circuits perform the aforementioned operations.

For this, the processor may be implemented as one or more of a central processing unit (CPU), a micro-controller, an application processor (AP) or a communication processor (CP), and an ARM processor. According to an embodiment of the disclosure, the processor may control the panel driver to set the pulse width of a driving current according to a PWM data voltage, and set the amplitude of a driving current according to a PAM data voltage. Here, the TFT substrate 30 is arranged in n rows and m columns, and the processor may control the panel driver such that a PWM data voltage is applied in row units (or horizontal line units). Also, the processor may control the panel driver such that a PAM data voltage is applied generally to the entire sub pixels of the TFT layer 33. Afterwards, the processor may control the panel driver such that a driving voltage VDD is applied at once to the plurality of pixel circuits included in the TFT layer 33, and a linearly changing voltage (a swipe voltage) is applied to the PWM driving circuits of each of the plurality of pixel circuits, and thereby display an image.

Herein, the processor and the timing controller are described as separate components, but depending on embodiments, the timing controller may perform the function of the processor, without the processor.

Referring to FIG. 2, in each pixel area 40 formed on the TFT layer 33, a plurality of sub pixels 50 (such as sub pixels 51, 52, 53), and a plurality of pixel circuits 61, 62, 63 for driving each sub pixel may be arranged.

The TFT layer 33 is formed on the front surface of the glass substrate 31, and it may include a multi-layer structure. As an example, the TFT layer 33 may include a buffer layer stacked on the front surface of the glass substrate 31, a gate insulation layer stacked on the buffer layer, an inter-layer insulation layer stacked on the gate insulation layer, and a plurality of passivation layers sequentially stacked on the inter-layer insulation layer. Also, the TFT layer 33 may include a wiring electronically connected to a voltage (VDD, VSS) terminal.

In an embodiment, three sub pixels 51, 52, 53 form one pixel. Each sub pixel may be a light emitting device, for example, a micro LED. Herein, the terms 'a sub pixel' and 'a micro LED' are used interchangeably.

As depicted, an example wherein the plurality of sub pixels includes three micro LEDs corresponding to red/green/blue (R/G/B) colors is described, but the disclosure is not necessarily limited thereto. That is, the plurality of sub pixels may alternatively include two micro LEDs of red/blue (R/B), red/green (R/G), or green/blue (G/B), or three micro LEDs of red/blue/white (R/B/W), or four micro LEDs of red/green/blue/white (R/G/B/W), red/green/green/white (R/G/G/W), or red/green/blue/yellow (R/G/B/Y), or five micro LEDs of red/green/blue/yellow/cyan (R/G/B/Y/C). In each case, the number of the pixel circuits may correspond to the number of the sub pixels.

The plurality of sub pixels 51, 52, 53 respectively include first electrodes (anode electrodes) 51a, 52a, 53a and second electrodes (cathode electrodes) 51b, 52b, 53b.

The first electrodes 51a, 52a, 53a of the respective sub pixels are respectively soldered to first TFT electrodes 35a, 36a, 37a, and are connected to a driving voltage (VDD) terminal through the first TFT electrodes 35a, 36a, 37a. Also, the second electrodes 51b, 52b, 53b of the respective sub pixels are respectively soldered to second TFT electrodes 35b, 36b, 37b, and are connected to a ground voltage (VSS) terminal through the second TFT electrodes 35b, 36b, 37b.

The plurality of pixel circuits 61, 62, 63 are electronically connected with the respective sub pixels 51, 52, 53, and control the respective corresponding sub pixels 51, 52, 53 to be driven to be turned on or turned off.

The R/G/B sub pixels 51, 52, 53 illustrated in FIG. 2 are an example, and they may respectively be formed as below. The red sub pixel 51 may include a blue micro LED having a red wavelength conversion layer stacked on the light emitting surface of the blue micro LED. The green sub pixel 52 may include a blue micro LED having a green wavelength conversion layer stacked on the light emitting surface of the blue micro LED. The blue sub pixel 53 may include a blue micro LED without a wavelength conversion layer.

Hereinafter, the structure of a micro LED according to an embodiment of the disclosure will be described. While an exemplary embodiment of a flip chip horizontal micro LED is described and illustrated herein, the disclosure is not limited thereto, and the structure may be a vertical micro LED that is not illustrated in the drawings.

Figure 3A:
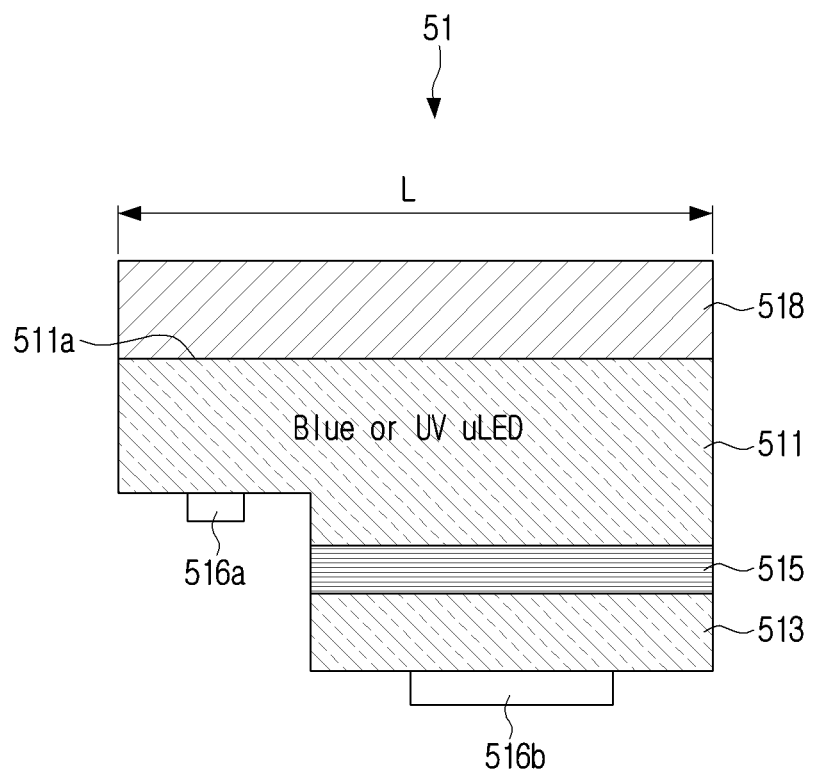
FIG. 3A is a schematic diagram illustrating a micro LED having a red wavelength conversion layer according to an embodiment of the disclosure.

FIG. 3A is a schematic diagram illustrating a micro LED having a red wavelength conversion layer according to an embodiment of the disclosure.

Referring to FIG. 3A, the maximum length L of the upper surface of the first micro LED 51 emitting a red light may be, for example, 60 µm or smaller.

The first micro LED 51 may include a first semiconductor layer 511, a second semiconductor layer 513, an active layer 515 formed between the first and second semiconductor layers, a first LED electrode 516a formed on the first semiconductor layer, a second LED electrode 516b formed on the second semiconductor layer, and a wavelength conversion layer 518 formed in a stack on the light emission surface 511a of the second semiconductor layer.

The first semiconductor layer 511 is a conductivity type semiconductor layer, and it may be an n-type (or a p-type) semiconductor layer. The second semiconductor layer 513 is a conductivity type semiconductor layer, and it may be a p-type (or an n-type) semiconductor layer.

For example, if the first semiconductor layer 511 is an n-type semiconductor layer, the second semiconductor layer 513 may be a p-type semiconductor layer, and in contrast, if the first semiconductor layer 511 is a p-type semiconductor layer, the second semiconductor layer 513 may be an n-type semiconductor layer.

The active layer 515 formed between the first and second semiconductor layers 511, 513 may include a so-called multiple-quantum-well (MQW) or a single-quantum-well (SQW).

The first electrode 516a is electronically connected to the first semiconductor layer 511, and it may be formed of any one of Al, Ti, Cr, Ni, Pd, Ag, Ge, and Au, or an alloy thereof. For ohmic contacts between the first electrode 516a and the first semiconductor layer 511, an electronic conductive oxide such as indium tin oxide (ITO) and ZnO may be used.

The second electrode 516b is electronically connected to the second semiconductor layer 513, and it may be formed of any one of Al, Ti, Cr, Ni, Pd, Ag, Ge, and Au, or an alloy thereof. For ohmic contacts between the second electrode 516b and the second semiconductor layer 513, an electronic conductive oxide such as indium tin oxide (ITO) and ZnO may be used.

The micro LED may be a blue micro LED having a light emission wavelength of 450-490 nm or a UV micro LED having a light emission wavelength of 360-410 nm including the first semiconductor layer 511, the second semiconductor layer 513, the active layer 515, the first LED electrode 516a, and the second LED electrode 516b described above. In this case, the blue and UV micro LEDs are an example, and they may be a semiconductor based on AlInGaN.

The wavelength conversion layer 518 may include polycrystalline films of chalcopyrite-structure semiconductors. Here, "a chalcopyrite-structure" means a crystalline structure. A chalcopyrite-structure semiconductor may be described as a I-III-VI$_2$ compound in general, and here, I, III, and VI indicate element groups of the periodic table.

The chemical formula of the wavelength conversion layer 518 may be basically described as $XYZ_2$. Here, X includes group I elements such as Ag and Cu, Y includes group III elements such as In, Ga, and Al, and Z includes group VI elements such as Se and S.

The wavelength conversion layer 518 is excited by the blue micro LED or the UV micro LED, and emits a red color. The wavelength conversion layer 518 may have a thickness necessary for absorbing an excitation light, for example, a thin thickness of about 2 µm at the maximum. Accordingly, the thickness of the wavelength conversion layer 518 may be thinner than the total sum of the thicknesses of the first and second semiconductor layers 511, 513 and the active layer 515.

For example, if the total sum of the thicknesses of the first and second semiconductor layers 511, 513 and the active layer 515 of the blue micro LED or the UV micro LED is 4

µm, the thickness of the red wavelength conversion layer 518 may be 2 µm at the maximum.

Also, in the first micro LED 51 according to an embodiment of the disclosure, an excitation light from the active layer 515 of the blue micro LED or the UV micro LED may be totally absorbed at the wavelength conversion layer 518, and thus a separate color filter for blocking the remaining excitation light is not needed.

The operation of the first micro LED 51 emitting a red light according to an embodiment of the disclosure is as follows.

When a current is applied to the blue micro LED from the TFT circuit through the first and second electrodes 516a, 516b, radiative recombination of the carrier is generated at the active layer 515. Accordingly, a light corresponding to the band gap energy is emitted from the active layer 515.

The light from the blue micro LED excites the carrier on the wavelength conversion layer 518. Then, the radiative recombination of the excited carrier is continued to radiation from the wavelength conversion layer 518. For example, the wavelength conversion layer 518 may emit a red light by emission of a blue light emitted from the blue micro LED located in the lower part of the wavelength conversion layer 518.

Figure 3B:
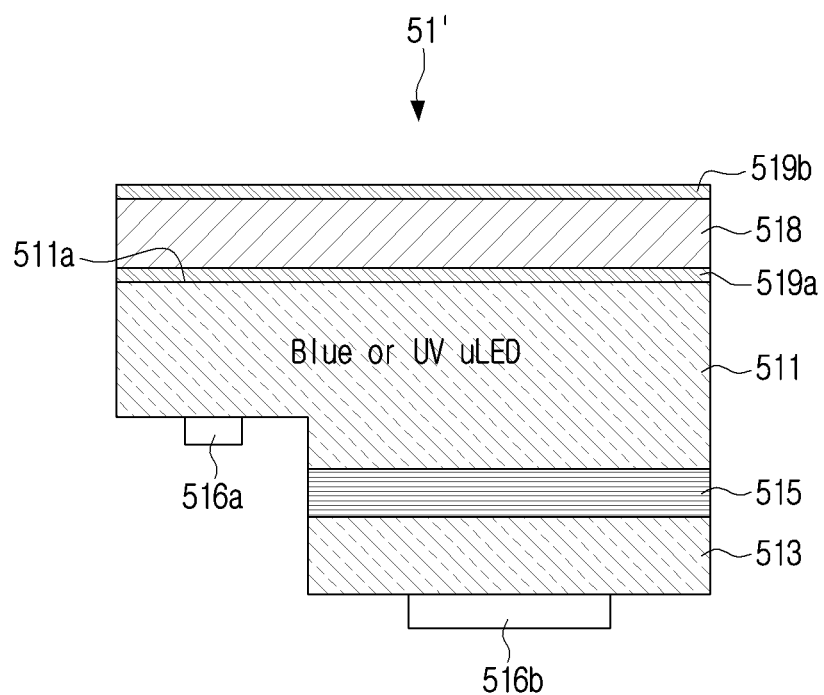
FIG. 3B is a schematic diagram illustrating a micro LED having passivation layers respectively on both surfaces of a red wavelength conversion layer according to another embodiment of the disclosure.

FIG. 3B is a schematic diagram illustrating a micro LED having passivation layers respectively on both surfaces of a red wavelength conversion layer according to another embodiment of the disclosure.

Referring to FIG. 3B, in the first micro LED 51', for improving the light emitting efficiency of the red wavelength conversion layer 518, first and second passivation layers 519a, 519b may be formed in a stack respectively on the upper surface and the lower surface of the wavelength conversion layer 518.

The first and second passivation layers 519a, 519b may be formed of any one material among ZnS, (Mg) ZnO, $Al_2O_3$, SiNx, SiON, and $SiO_2$. The first and second passivation layers 519a, 519b may repress surface recombination of the carrier excited on the red wavelength conversion layer 518. The thickness of each of the first and second passivation layers 519a, 519b may be in a range of from 10 nm to 1000 nm.

Figure 4:
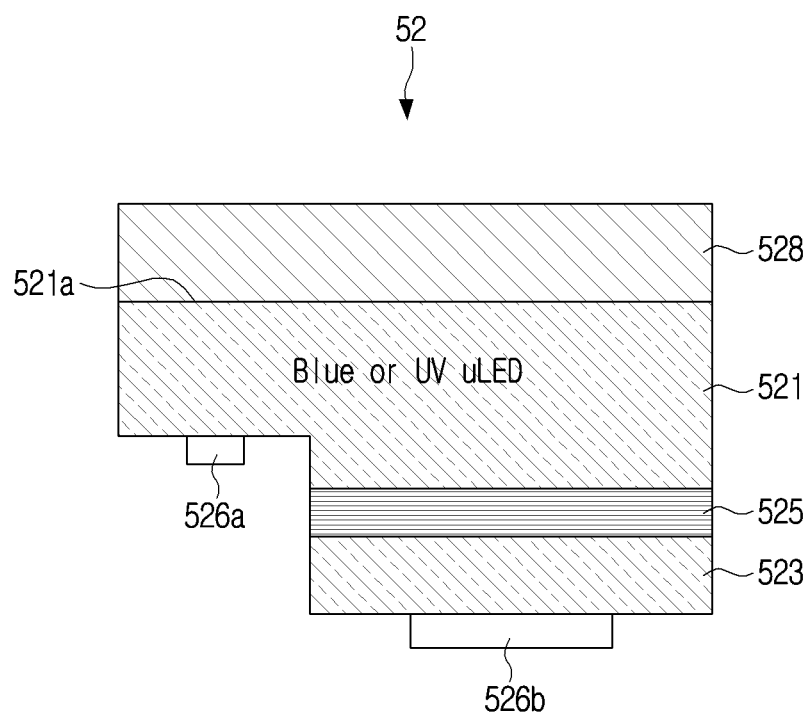
FIG. 4 is a schematic diagram illustrating a micro LED having a green wavelength conversion layer according to still another embodiment of the disclosure.

FIG. 4 is a schematic diagram illustrating a micro LED having a green wavelength conversion layer according to an embodiment of the disclosure.

Referring to FIG. 4, the second micro LED 52 emitting a green light may be formed of the same structure as the aforementioned first micro LED 51 emitting a red light. However, the second micro LED 52 is different from the first micro LED 51 in that it includes a wavelength conversion layer 528 emitting a green light.

The second micro LED 52 may include a first semiconductor layer 521, a second semiconductor layer 523, an active layer 525 formed between the first and second semiconductor layers, a first LED electrode 526a formed on the first semiconductor layer, a second LED electrode 526b formed on the second semiconductor layer, and a wavelength conversion layer 528 formed in a stack on the light emission surface 521a of the second semiconductor layer.

The operation of the second micro LED 52 emitting a green light according to an embodiment of the disclosure is as follows.

When a current is applied to the blue micro LED from the TFT circuit through the first and second electrodes 526a, 526b, radiative recombination of the carrier is generated at the active layer 525. Accordingly, a light corresponding to the band gap energy is emitted from the active layer 525.

The light from the blue micro LED excites the carrier on the wavelength conversion layer 528. Then, the radiative recombination of the excited carrier is continued to radiation from the wavelength conversion layer 528. For example, the wavelength conversion layer 528 may emit a green light by emission of a blue light emitted from the blue micro LED located in the lower part of the wavelength conversion layer 528.

Figure 5:
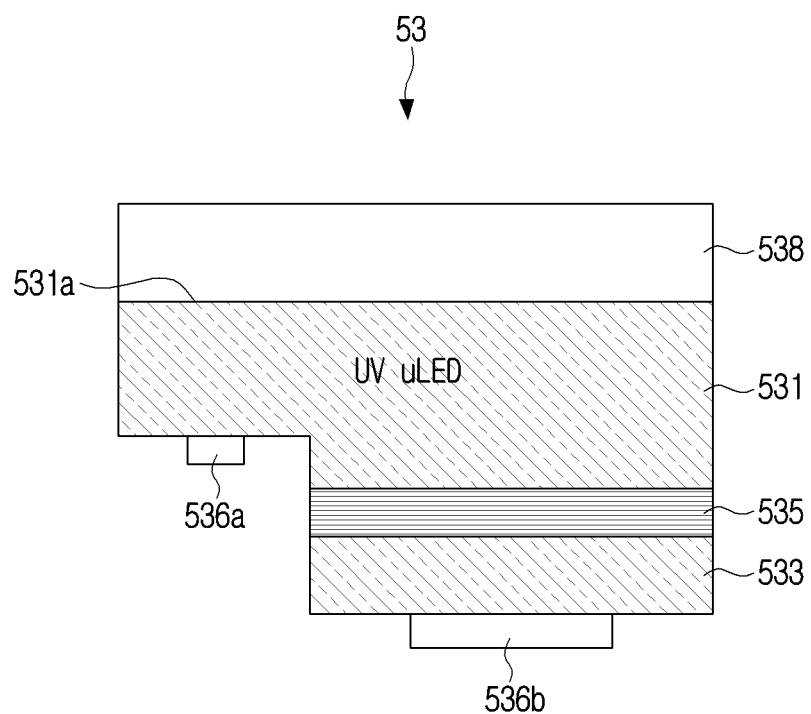
FIG. 5 is a schematic diagram illustrating a micro LED having a blue wavelength conversion layer according to still another embodiment of the disclosure.

FIG. 5 is a schematic diagram illustrating a micro LED having a blue wavelength conversion layer according to an embodiment of the disclosure.

Referring to FIG. 5, the third micro LED 53 emitting a blue light may be formed of the same structure as the aforementioned first micro LED 51 emitting a red light. However, the third micro LED 53 is different from the first micro LED 51 in that it includes a wavelength conversion layer 538 emitting a blue light, and uses a UV micro LED instead of a blue micro LED.

The third micro LED 53 may include a first semiconductor layer 531, a second semiconductor layer 533, an active layer 535 formed between the first and second semiconductor layers, a first LED electrode 536a formed on the first semiconductor layer, a second LED electrode 536b formed on the second semiconductor layer, and a wavelength conversion layer 538 formed in a stack on the light emission surface 531a of the second semiconductor layer.

The operation of the third micro LED 53 emitting a blue light according to an embodiment of the disclosure is as follows.

When a current is applied to the blue micro LED from the TFT circuit through the first and second electrodes 536a, 536b, radiative recombination of the carrier is generated at the active layer 535. Accordingly, a light corresponding to the band gap energy is emitted from the active layer 535.

The light from the UV micro LED excites the carrier on the wavelength conversion layer 538. Then, the radiative recombination of the excited carrier is continued to radiation from the wavelength conversion layer 538. For example, the wavelength conversion layer 538 may emit a blue light by emission of a UV light emitted from the UV micro LED located in the lower part of the wavelength conversion layer 538. In this case, the wavelength conversion layer 538 may only be excited by the UV micro LED due to the energy requirement for transition between bands.

Figure 6:
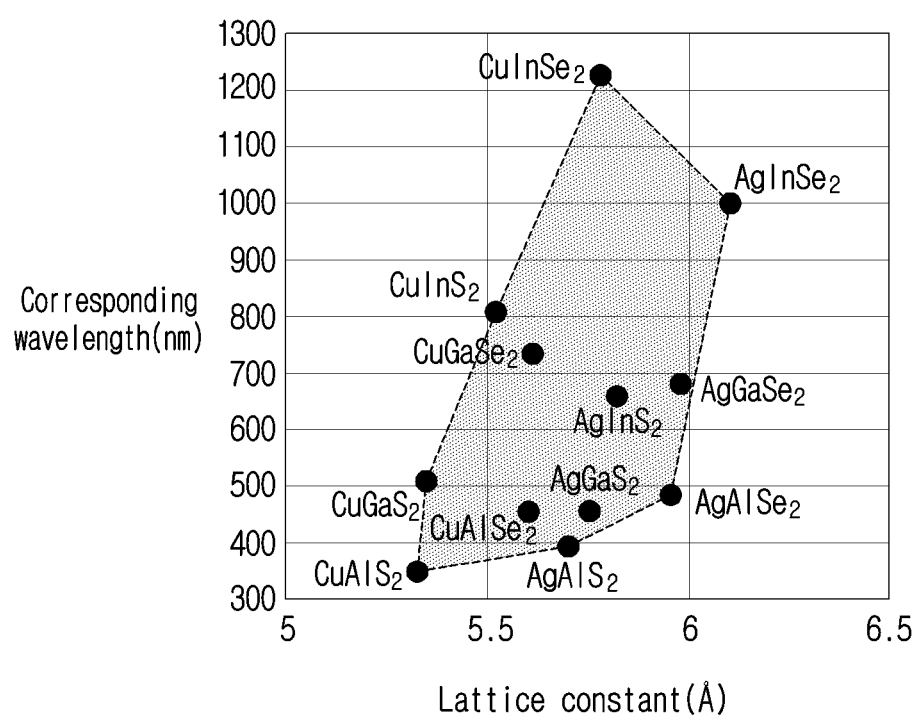
FIG. 6 is a graph illustrating a relationship between a lattice constant and a corresponding wavelength calculated from band gap energy of a wavelength conversion layer in a chalcopyrite-structure.

FIG. 6 is a graph illustrating a relationship between a lattice constant and a corresponding wavelength calculated from band gap energy of a wavelength conversion layer in a chalcopyrite-structure.

Referring to FIG. 6, the wavelength conversion layer in a chalcopyrite-structure provided in the micro LED according to an embodiment of the disclosure may cover a wide wavelength range reaching UV rays from infrared rays by changing chemical components.

As the wavelength conversion layer adjusts the composition of X, Y, and Z to form a display application, the band gap may correspond to necessary light emission wavelength areas, i.e., red (600-750 nm), green (520-560 nm), and blue (450-490 nm). Additional elements such as Zn, Sn, Si, and Te may be doped on the wavelength conversion material for improving the material characteristic.

The wavelength conversion layer in a chalcopyrite-structure formed of a $I\text{-}III\text{-}VI_2$ compound has the following characteristic.

The wavelength conversion layer has a direct transition-type band structure. Such a characteristic indicates that the wavelength conversion layer has high possibility of emitting a strong light.

Also, the wavelength conversion layer has a big absorption coefficient (~$10^5$ cm$^{-1}$). Such a characteristic indicates that the thickness necessary for absorbing an excitation light may have a maximum width of about 2 μm. Accordingly, the film thickness of the wavelength conversion layer including the chalcopyrite-structure semiconductor may be thinner than the total thickness of the first and second semiconductor layers and the active layer. For example, while the total thickness of the first and second semiconductor layers and the active layer of the blue micro LED (or the UV micro LED) is 4 μm, the thickness of the wavelength conversion layer may be about 2 μm. Also, in the micro LED device according to an embodiment of the disclosure, an excitation light from the active layer of the blue micro LED (or the UV micro LED) can be totally absorbed at the wavelength conversion layer, and thus a color filter is not needed for blocking the remaining excitation light.

In addition, the wavelength conversion layer has low sensitivity of electronic and optical characteristics regarding crystalline defects. Such a characteristic indicates possibility that the wavelength conversion layer has high performance in a polycrystalline form. Accordingly, the wavelength conversion layer based on the I-III-VI$_2$ compound may be formed of a thin polycrystalline film, and it can operate as a wavelength conversion layer having high performance without a color filter.

Figure 7:
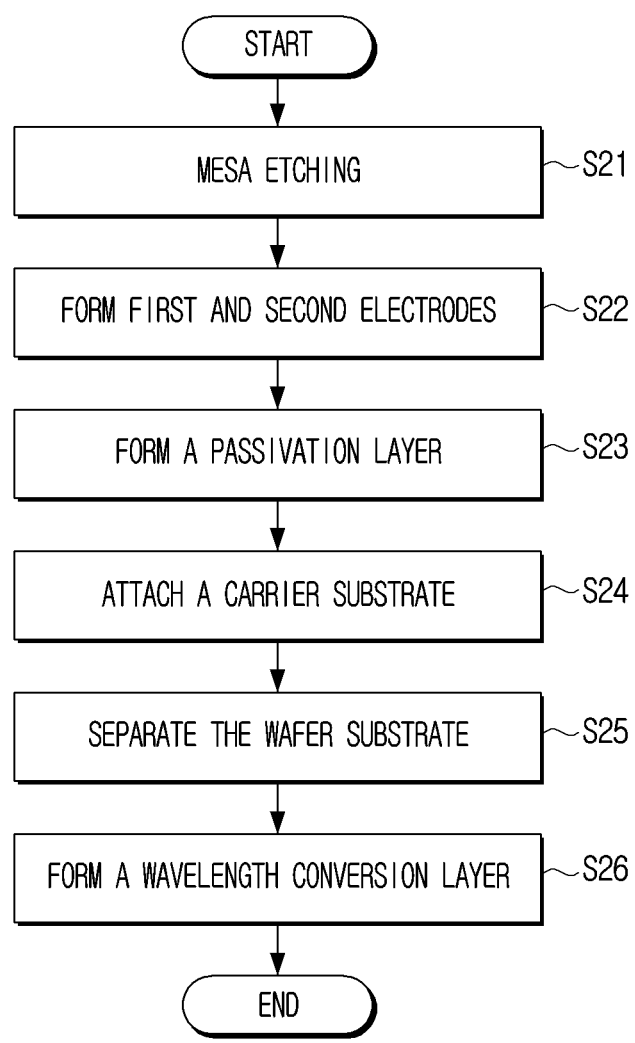
FIG. 7 is a flow chart illustrating a manufacturing process of a micro LED according to an embodiment of the disclosure.

FIG. 7 is a flow chart illustrating a manufacturing process of a micro LED according to an embodiment of the disclosure, and FIG. 8A to FIG. 8G are process diagrams sequentially illustrating a manufacturing process of a micro LED according to an embodiment of the disclosure.

Figure 8A:
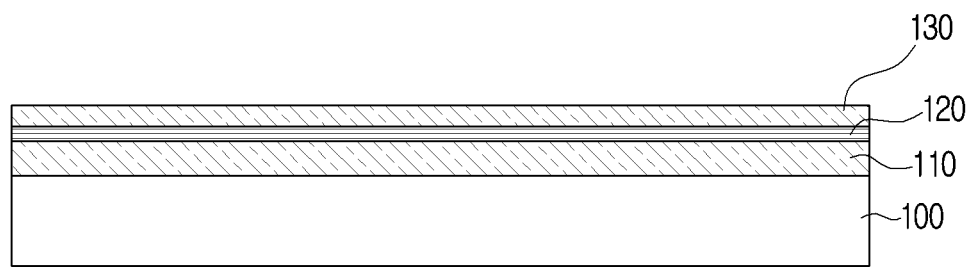
FIG. 8A to FIG. 8G are process diagrams sequentially illustrating a manufacturing process of a micro LED according to an embodiment of the disclosure.

Referring to FIG. 8A, on the wafer 100, for example, a stacked semiconductor epitaxial structure for forming a blue micro LED through an epitaxial process is formed in operation S21 according to an embodiment of the disclosure.

A blue micro LED is used as an example, but the structure stacked on the wafer is not limited to a structure for forming a blue micro LED, and may instead be, for example, a structure for forming a UV micro LED.

The semiconductor epitaxial structure having a stacking order of the first semiconductor layer 110, the active layer 120, and the second semiconductor layer 130 is formed on the wafer 100 through epitaxial growing technologies such as metalorganic vapor phase epitaxy (MOVPE), molecular beam epitaxy (MBE), and sputtering. The wafer 100 is generally a monocrystalline bulk wafer of sapphire, Si, SiC, GaAs, GaP, and GaN.

The first semiconductor layer 110 is a conductivity type semiconductor layer, and it may be an n-type semiconductor layer, and the second semiconductor layer 130 is a conductivity type semiconductor layer, and it may be a p-type semiconductor layer. In contrast, the first semiconductor layer 110 may be a p-type semiconductor layer, and the second semiconductor layer 130 may be an n-type semiconductor layer.

Figure 8B:
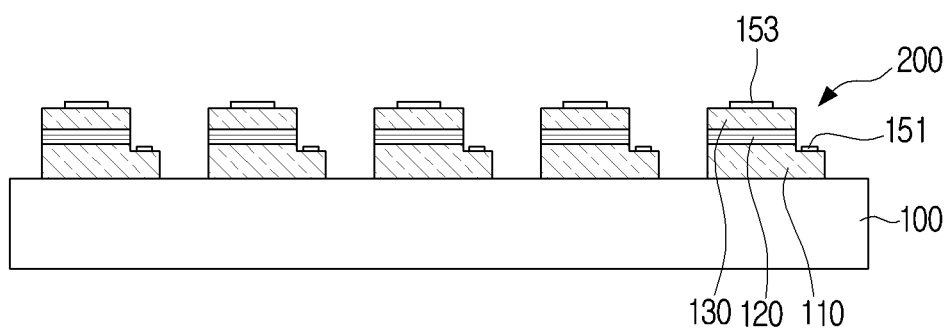

Referring to FIG. 8B, a mesa etching processing is performed on the semiconductor epitaxial structure in operation S22 according to an embodiment of the disclosure.

The mesa etching process may be performed, for example, by photolithography and a dry etching process. Accordingly, in the semiconductor epitaxial structure, a plurality of blue micro LEDs may be independently formed respectively at a specific interval.

In this case, one surface of the first semiconductor layer 110 (the surface contacting the wafer 100) is used as a light emission surface.

Also, a first electrode 151 is formed on the first semiconductor layer 110, and a second electrode 153 is formed on the second semiconductor layer 130 in operation S23.

The first and second electrodes 151, 153 may be formed, for example, by a lift-off process, and here, for ohmic contacts between the first electrode 151 and the first semiconductor layer 110 and between the second electrode 153 and the second semiconductor layer 130, an electronic conductive oxide such as indium tin oxide (ITO) and ZnO may be used. Such ohmic substances may be deposited on the first and second semiconductor layers 110, 130 by various technologies such as sputtering, evaporation, and spin coating.

Herein, a structure including the first semiconductor layer 110, the active layer 120, the second semiconductor layer 130, and the first and second electrodes 151, 153 is referred to as a blue micro LED 200.

Figure 8C:
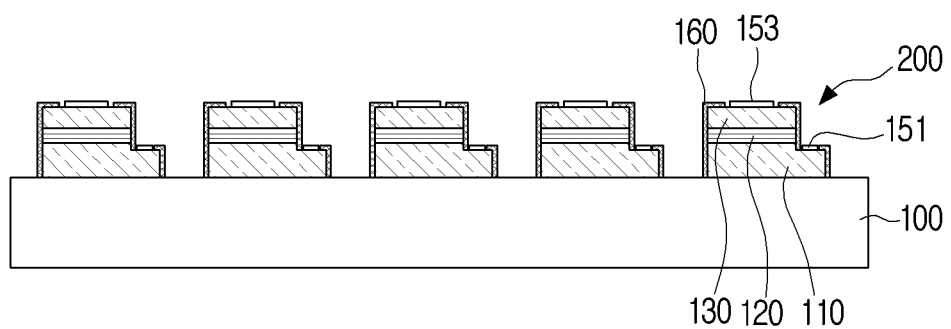

Referring to FIG. 8C, a passivation layer 160 is formed on the surface of the blue micro LED 200 in operation S24 according to an embodiment of the disclosure.

In this case, the passivation layer 160 is formed so that it does not cover the first and second electrodes 151, 153 when it is formed in a stack on the surface of the blue micro LED 200.

The passivation layer 160 may be formed of substances such as Al$_2$O$_3$, SiO$_2$, and SiN. The passivation layer may be formed by various technologies such as atomic layer deposition, e-beam deposition, sputtering, chemical vapor deposition, and spin coating.

Although not illustrated in the drawings, after the passivation layer 160 is formed, a mirror layer such as distributed Bragg reflectors (DBR) may be formed in a stack on an outer surface the passivation layer for improving light extracting efficiency of micro LEDs.

Figure 8D:
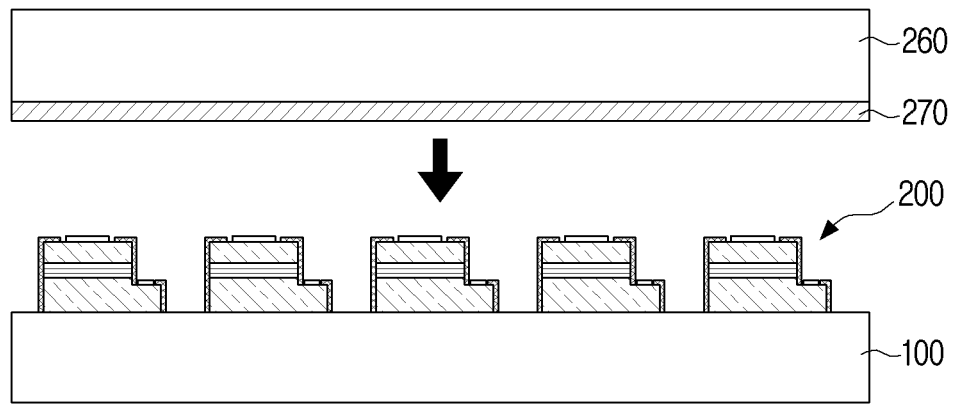

Referring to FIG. 8D, the carrier substrate 260 is moved to the side of the wafer 100, and one surface of the carrier substrate 260 is attached to the plurality of blue micro LEDs 200 in operation S25 according to an embodiment of the disclosure.

The carrier substrate 260 is a substrate for transferring the plurality of micro LEDs 210 (refer to FIG. 8G) to be separated from the wafer 100 to the TFT substrate 30.

On one surface of the carrier substrate 260, an adhesion layer 270 is formed. The plurality of blue micro LEDs 200 may achieve a stable adhered state to the carrier substrate 260 by the adhesion layer 270.

The adhesion layer 270 may also be referred to as a dynamic release layer (DRL), and may be formed of a material that can be easily separated from the carrier substrate 260 (e.g., polyimide) when transferring the micro LEDs 210 (refer to FIG. 8G) to be described below to the TFT layer 33 of the TFT substrate 30 (refer to FIG. 2) by a transfer method using laser. The laser transfer method is a method of, for example, locating the carrier substrate 260 on the upper side of the TFT substrate 30 at a specific interval, and then heating a portion of the adhesion layer 270 to which the micro LEDs 210 are fixed by irradiating a laser beam on the carrier substrate, and thereby separating the micro LEDs 210 from the carrier substrate 260 and transferring them to the TFT substrate 30.

Figure 8E:
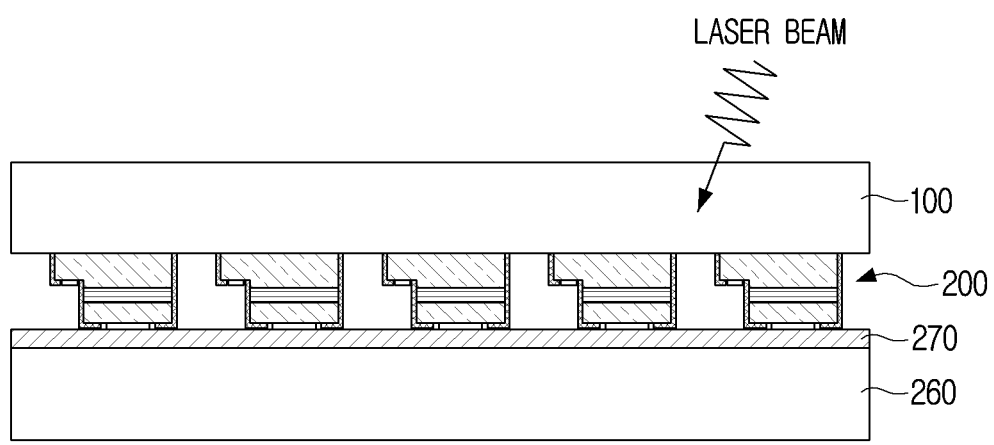
Figure 8F:
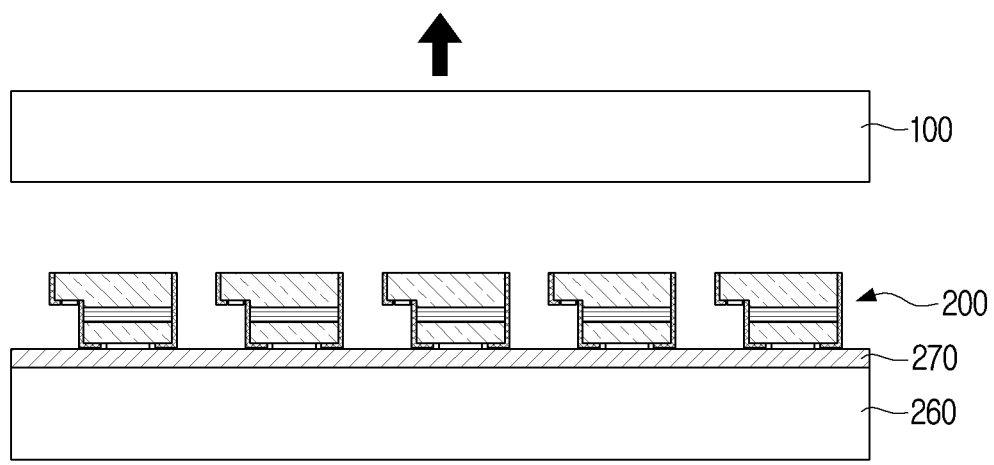

Referring to FIG. 8E and FIG. 8F, the plurality of blue micro LEDs 200 attached to the carrier substrate 260 and the wafer 100 are separated by irradiating a laser beam on the rear surface of the wafer 100 in operation S25 according to an embodiment of the disclosure.

The wafer 100 is separated from the plurality of blue micro LEDs 200 by technologies such as pulverizing, wet etching, dry etching, and laser lift off (LLO). The plurality of blue micro LEDs 200 are supported by the carrier substrate 260 having the adhesion layer 270 on the surface during the process of being separated from the wafer 100.

Figure 8G:
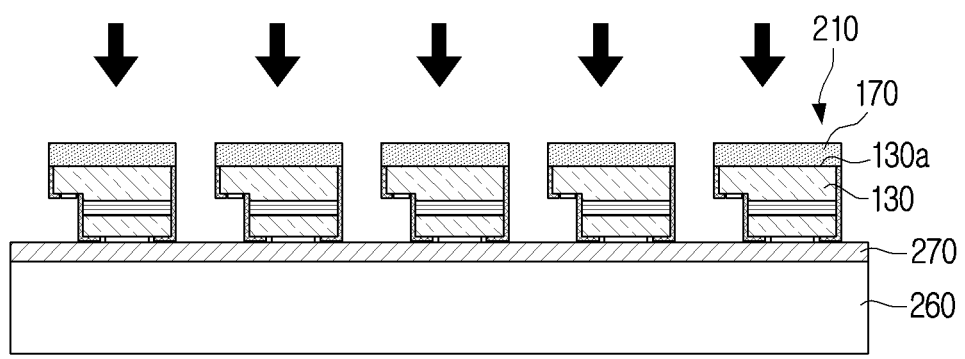

Referring to FIG. 8G, in the state of having been separated from the wafer 100, a wavelength conversion layer 170 is formed in a stack on the light emission surface 130a of the second semiconductor layer 130 of each blue micro LED 200 in operation S26 according to an embodiment of the disclosure.

As described above, the micro LED 210 according to an embodiment of the disclosure may include a blue micro LED 200 and a blue micro wavelength conversion layer 170.

The wavelength conversion layer 170 may be formed of a semiconductor polycrystalline thin film in a chalcopyrite-structure. In this case, the wavelength conversion layer 170 may be, for example, deposited as a thin film on the light emission surface 130a of the second semiconductor layer 130 of the blue micro LED 200 by technologies such as sputtering and co-evaporation.

The composition of the wavelength conversion layer 170 may be adjusted to suit the wavelength required by the display application. For example, the composition of the wavelength conversion layer 170 is adjusted by the ratio of supplied element source substances such as Cu, Ag, In, Ga, Al, S, and Se.

Referring to FIG. 2 again, the plurality of micro LEDs 51, 52, 53 may be connected to the TFT circuit of the TFT substrate 30 and/or a driver circuit such as an Si-based integrated circuit through a transfer process. Here, the transfer process may be, for example, laser-based transfer, stamp-based transfer, roll transfer, etc.

The first electrodes 51a, 52a, 53a and the second electrodes 51b, 52b, 53b of the respective micro LEDs are electronically connected to the first TFT electrodes 35a, 36a, 37a and the second TFT electrodes 35b, 36b, 37b of the TFT layer 33. Accordingly, the respective micro LEDs 51, 52, 53 become self-luminous sub pixels of the display module 10, and form one pixel.

One pixel may include three sub pixels R/G/B. Hereinafter, various combinations of three sub pixels will be described with reference to FIG. 9 to FIG. 11.

Figure 9:
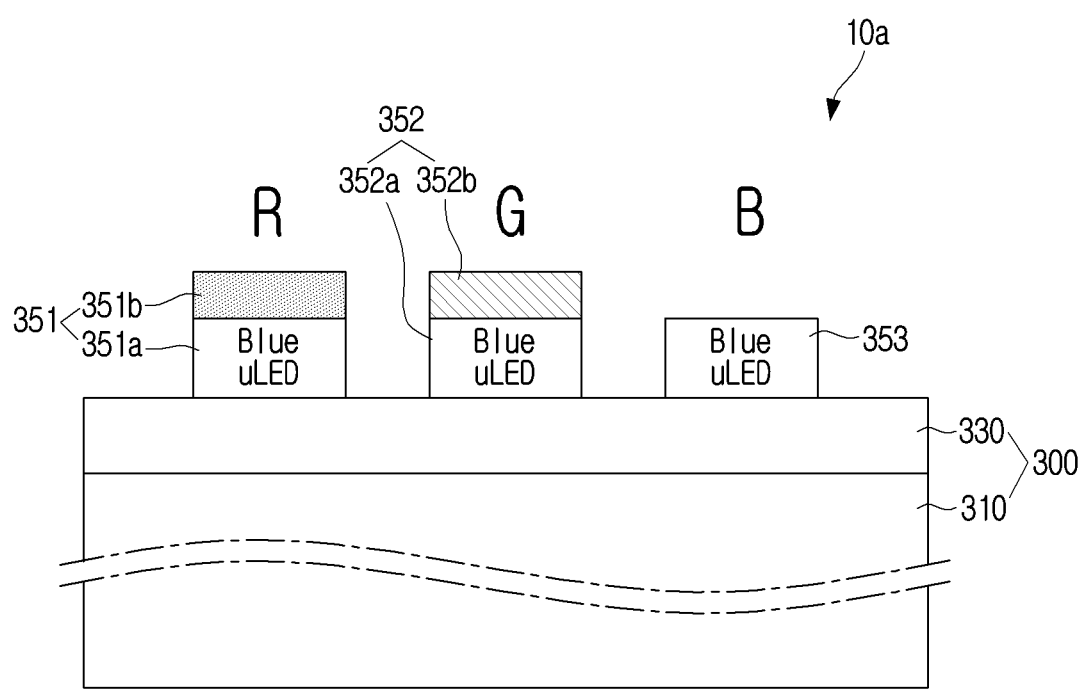
FIG. 9 is a side view schematically illustrating a pixel of a display module according to an embodiment of the disclosure.

FIG. 9 is a side view schematically illustrating a pixel of a display module according to an embodiment of the disclosure. In FIG. 9, 10a is a display module, 300 is a TFT substrate, 310 is a glass substrate, and 330 is a TFT layer.

Referring to FIG. 9, a pixel formed on the display module 10a may include a red sub pixel 351 emitting a red light, a green sub pixel 352 emitting a green light, and a blue sub pixel 353 emitting a blue light.

The red sub pixel 351 may include a first blue micro LED 351a, and a red wavelength conversion layer 351b formed as a thin film on the light emission surface of the first blue micro LED 351a. In the red sub pixel 351, the red wavelength conversion layer 351b is excited by a blue light emitted from the first blue micro LED 351a, and emits a red light.

The green sub pixel 352 may include a second blue micro LED 352a, and a green wavelength conversion layer 352b formed as a thin film on the light emission surface of the second blue micro LED 352a. In the green sub pixel 352, the green wavelength conversion layer 352b is excited by a blue light emitted from the second blue micro LED 352a, and emits a green light.

The blue sub pixel 353 may include a third blue micro LED 353 emitting a blue light, without a wavelength conversion layer.

As described above, in a combination of R/G/B sub pixels, the red and green sub pixels 351, 352 respectively have a red wavelength conversion layer 351b and a green wavelength conversion layer 352b, but the blue sub pixel 353 may be formed without a blue wavelength conversion layer.

Figure 10:
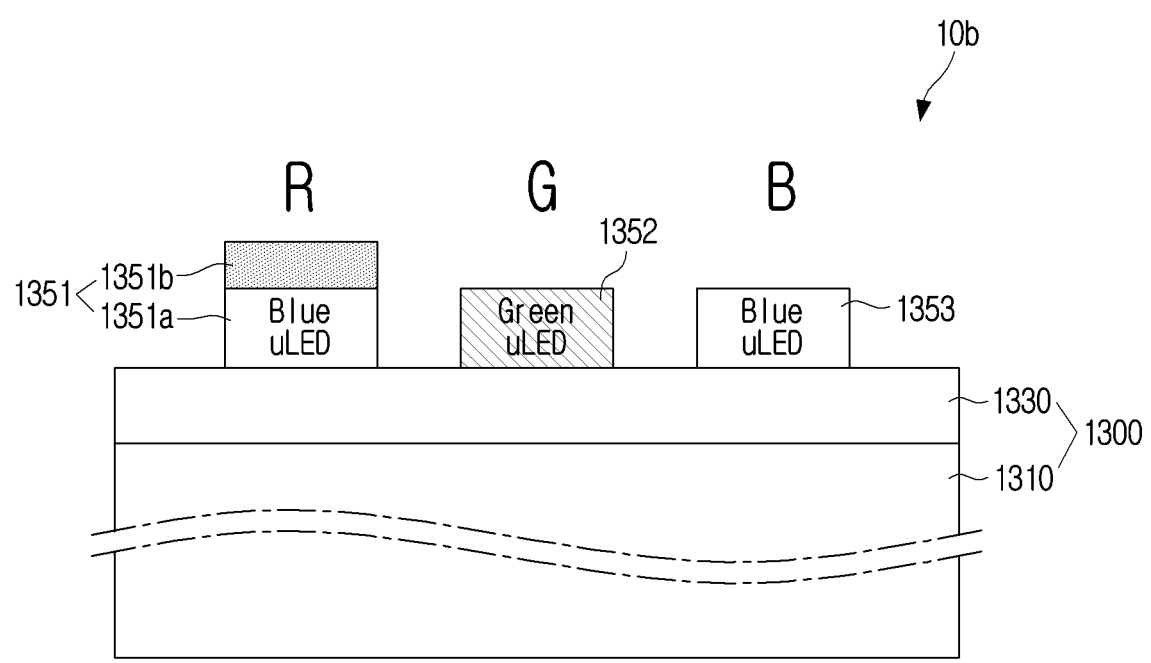
FIG. 10 is a side view schematically illustrating another example of a pixel of a display module according to another embodiment of the disclosure.

FIG. 10 is a side view schematically illustrating another example of a pixel of a display module according to another embodiment of the disclosure. In FIG. 10, 10b is a display module, 1300 is a TFT substrate, 1310 is a glass substrate, and 1330 is a TFT layer.

Referring to FIG. 10, a pixel formed on the display module 10b may include a red sub pixel 1351 emitting a red light, a green sub pixel 1352 emitting a green light, and a blue sub pixel 1353 emitting a blue light.

The red sub pixel 1351 may include a first blue micro LED 1351a, and a red wavelength conversion layer 1351b formed as a thin film on the light emission surface of the first blue micro LED 1351a. In the red sub pixel 1351, the red wavelength conversion layer 1351b is excited by a blue light emitted from the first blue micro LED 1351a, and emits a red light.

The green sub pixel 1352 may include a green micro LED 1352 emitting a green light, without a wavelength conversion layer.

The blue sub pixel 1353 may include a blue micro LED 1353 emitting a blue light, without a wavelength conversion layer.

As described above, in a combination of R/G/B sub pixels, the red sub pixel 1351 has a red wavelength conversion layer 1351b, but the green and blue sub pixels 1352, 1353 may be formed without a blue wavelength conversion layer.

Figure 11:
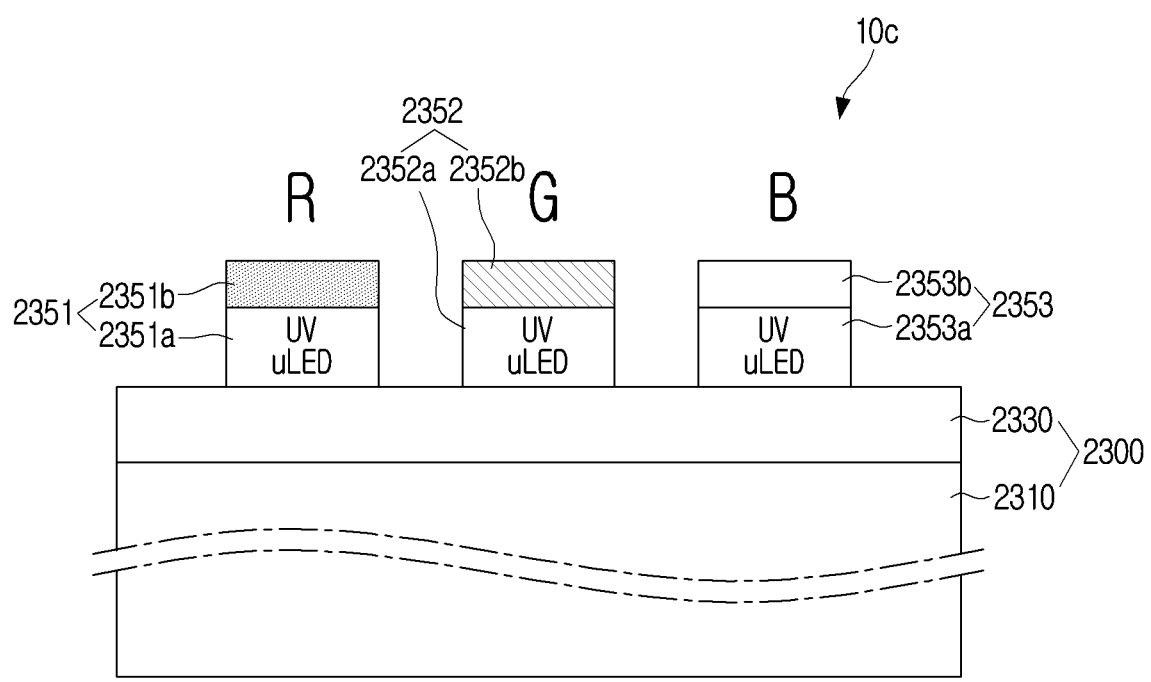
FIG. 11 is a side view schematically illustrating a pixel in a micro LED display according to still another embodiment of the disclosure.

FIG. 11 is a side view schematically illustrating a pixel in a micro LED display according to still another embodiment of the disclosure. In FIG. 11, 10c is a display module, 2300 is a TFT substrate, 2310 is a glass substrate, and 2330 is a TFT layer.

Referring to FIG. 11, a pixel formed on the display module 10c may include a red sub pixel 2351 emitting a red light, a green sub pixel 2352 emitting a green light, and a blue sub pixel 2353 emitting a blue light.

The red sub pixel 2351 may include a first UV micro LED 2351a, and a red wavelength conversion layer 2351b formed as a thin film on the light emission surface of the first UV micro LED 2351a. In the red sub pixel 2351, the red wavelength conversion layer 2351b is excited by a UV light emitted from the first UV micro LED 2351a, and emits a red light.

The green sub pixel 2352 may include a second UV micro LED 2352a, and a green wavelength conversion layer 2352b formed as a thin film on the light emission surface of the second UV micro LED 2352a. In the green sub pixel 2352, the green wavelength conversion layer 2352b is excited by a UV light emitted from the second UV micro LED 2352a, and emits a green light.

The blue sub pixel 2353 may include a third UV micro LED 2353a, and a blue wavelength conversion layer 2353b formed as a thin film on the light emission surface of the third UV micro LED 2353a. In the blue sub pixel 2353, the blue wavelength conversion layer 2353b is excited by a UV light emitted from the third UV micro LED 2353a, and emits a blue light.

As described above, in a combination of R/G/B sub pixels, the red and green sub pixels 2351, 2352 respectively have a red wavelength conversion layer 2351b and a green wavelength conversion layer 2352b, but the blue sub pixel 2353 may be formed without a blue wavelength conversion layer.

The red and green wavelength conversion layers 2351b, 2352b may be excited by the blue micro LED and the UV micro LED. However, the blue wavelength conversion layer 2353b may only be excited by the UV micro LED due to the energy requirement for transition between bands.

As described above, the micro LED may include a wavelength conversion layer, which may be a semiconductor layer in a chalcopyrite-structure based on the I-III-VI$_2$ compound. The thickness of the wavelength conversion layer is formed to be thinner than the total thickness of the blue micro LED (the first and second semiconductor layers and the active layer).

Accordingly, the micro LED according to an embodiment of the disclosure can have a simple structure and an efficient light emitting capacity. For example, in the micro LED according to an embodiment of the disclosure, an encapsulated structure required in an LED having a phosphor according to the conventional technology is not needed, a separate cover layer that makes a wavelength conversion layer become far from the micro LED does not need to be formed, and a color filter layer making only light from a wavelength conversion layer pass through does not need to be formed.

Figure 12:
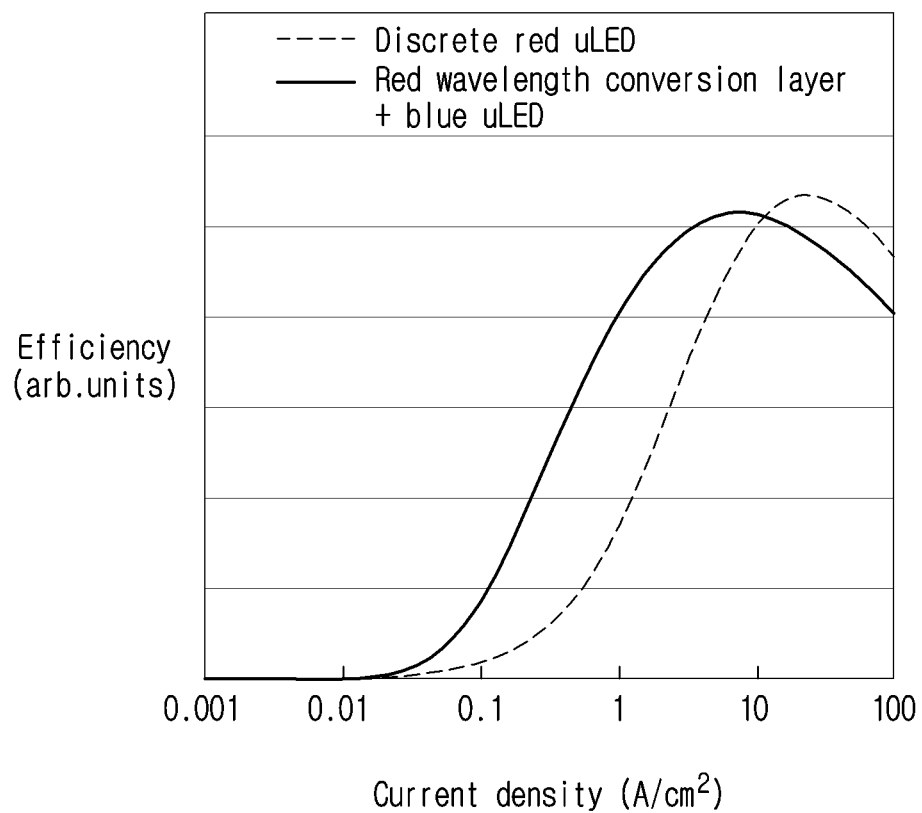
FIG. 12 is a graph comparing an efficiency of a micro LED according to an embodiment of the disclosure with an efficiency of a conventional micro LED.

The micro LED according to an embodiment of the disclosure exerts higher efficiency compared to a conventional red micro LED, as shown in the graph of FIG. 12.

In FIG. 12, the dotted line is a curved line of a conventional red micro LED based on AlGaInP, and the solid line is a curved line of a blue micro LED including a red wavelength conversion layer. It can be seen that the efficiency of a low current operation area (0.1-10 A/cm$^2$) generally used in a micro LED operation in a display module has been greatly improved compared to a conventional red micro LED.

Also, in a structure including a blue micro LED and a red wavelength conversion layer stacked thereon, thermal stability in the strength of a red light can be improved.

As described above, a display module to which micro LEDs according an embodiment of to the disclosure are applied uses micro LEDs that are highly efficient and thermally stable as components forming sub pixels, and thus the display module can have high color reproducibility, low power consumption, a high dynamic range, and a high contrast.

While preferred embodiments of the disclosure have been shown and described, the disclosure is not limited to the aforementioned specific embodiments, and it is apparent that various modifications may be made by those having ordinary skill in the technical field to which the disclosure belongs, without departing from the gist of the disclosure as claimed by the appended claims. Further, it is intended that such modifications are not to be interpreted independently from the technical idea or prospect of the disclosure.

The disclosure relates to a micro LED and a display module including the same.

What is claimed is:

1. A micro LED comprising:
   a first semiconductor layer which has a light emission surface and to which a first electrode is electronically connected;
   a second semiconductor layer to which a second electrode is electronically connected;
   an active layer arranged between the first and the second semiconductor layers;
   a wavelength conversion layer which is stacked on the light emission surface of the first semiconductor layer, the wavelength conversion layer including a semiconductor in a chalcopyrite-structure,
   a first passivation layer between the light emission surface of the first semiconductor layer and the wavelength conversion layer; and
   a second passivation layer on an upper surface of the wavelength conversion layer.

2. The micro LED of claim 1,
   wherein a chemical composition of the wavelength conversion layer is described as XYZ$_2$,
   X includes Ag and Cu which are group I elements,
   Y includes In, Ga, and Al which are group III elements, and
   Z includes Se and S which are group VI elements.

3. The micro LED of claim 1,
   wherein, on the wavelength conversion layer, Zn, Sn, Si, and Te are doped.

4. The micro LED of claim 1,
   wherein the wavelength conversion layer has a thickness that is less than a total sum of thicknesses of the first semiconductor layer, the active layer, and the second semiconductor layer.

5. The micro LED of claim 1,
   wherein the first semiconductor layer, the active layer, and the second semiconductor layer form a blue micro LED.

6. The micro LED of claim 5,
   wherein the wavelength conversion layer includes a red light wavelength area formed to emit a red light by being excited by a blue light emitted from the blue micro LED.

7. The micro LED of claim 5,
   wherein the wavelength conversion layer includes a green light wavelength area formed to emit a green light by being excited by a blue light emitted from the blue micro LED.

8. The micro LED of claim 1, further comprising:
   a mirror layer stacked on an outer surface of the passivation layer.

9. The micro LED of claim 1,
   wherein the first semiconductor layer, the active layer, and the second semiconductor layer form an ultra-violet (UV) micro LED.

10. The micro LED of claim 9,
    wherein the wavelength conversion layer includes a blue light wavelength area formed to emit a blue light by being excited by a UV light emitted from the UV micro LED.

11. The micro LED of claim 9,
    wherein the wavelength conversion layer includes a red light wavelength area formed to emit a red light by being excited by a UV light emitted from the UV micro LED.

12. The micro LED of claim 9,
    wherein the wavelength conversion layer includes a green light wavelength area formed to emit a green light by being excited by a UV light emitted from the UV micro LED.

13. The micro LED of claim 9, further comprising:
    a mirror layer stacked on an outer surface of the second passivation layer.

14. A display module comprising:
    a TFT substrate including a glass substrate and a thin film transistor (TFT) layer formed on one surface of the glass substrate; and a plurality of micro light emitting diodes (LEDs) which are electronically connected to a plurality of TFT electrodes formed on the TFT layer, the plurality of micro LEDs being arranged in pixel units, wherein each of the plurality of micro LEDs respectively comprise:

a first semiconductor layer which has a light emission surface and to which a first electrode is electronically connected, a second semiconductor layer to which a second electrode is electronically connected, an active layer arranged between the first and the second semiconductor layers, a wavelength conversion layer which is stacked on the light emission surface of the first semiconductor layer and includes a semiconductor in a chalcopyrite-structure, a first passivation layer between the light emission surface of the first semiconductor layer and the wavelength conversion layer, and a second passivation layer on an upper surface of the wavelength conversion layer.

* * * * *